US006357275B1

(12) United States Patent
Ellis et al.

(10) Patent No.: US 6,357,275 B1
(45) Date of Patent: Mar. 19, 2002

(54) APPARATUS AND METHOD FOR PROVIDING MECHANICALLY PRE-FORMED CONDUCTIVE LEADS

(75) Inventors: Ronald W. Ellis; Tracy Reynolds, both of Boise; Michael Bettinger, Eagle, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/721,028

(22) Filed: Nov. 21, 2000

Related U.S. Application Data (62) Division of application No. 09/378,198, filed on Aug. 19, 1999, now Pat. No. 6,221,748.

(51) Int. Cl.$^7$ ................................................ B21D 22/02
(52) U.S. Cl. ........................................... 72/414; 29/827
(58) Field of Search ................... 72/414, 386; 140/173, 140/123, 106; 29/827, 882

(56) References Cited

U.S. PATENT DOCUMENTS

| | | | | |
|---|---|---|---|---|
| 2,596,375 A | * | 5/1952 | Daniels | 29/882 |
| 3,597,839 A | * | 8/1971 | Jaccodise | 29/626 |
| 3,689,991 A | * | 9/1972 | Aird | 29/577 |
| 4,268,942 A | * | 5/1981 | Meal | 29/827 |
| 4,553,420 A | * | 11/1985 | Fierkens | 29/827 |
| 5,233,221 A | * | 8/1993 | Bregman | 257/674 |
| 5,271,146 A | * | 12/1993 | Kashiwagi | 29/827 |
| 5,508,232 A | * | 4/1996 | Ueda | 437/211 |
| 5,536,909 A | * | 7/1996 | DiStefano | 174/261 |
| 5,586,389 A | * | 12/1996 | Hirao | 29/841 |
| 5,994,222 A | * | 11/1999 | Smith | 438/689 |

FOREIGN PATENT DOCUMENTS

JP   406069393 A   3/1994

* cited by examiner

Primary Examiner—Daniel C. Crane
(74) Attorney, Agent, or Firm—Dorsey & Whitney LLP (57) ABSTRACT

The present invention is directed toward an apparatus and method for providing mechanically pre-formed conductive leads. In one embodiment of the invention, an apparatus includes a forming chuck engageable with a first surface of a conductive sheet, and a receiving chuck engageable with a second surface of the conductive sheet opposite from the forming chuck. The forming chuck has a raised forming portion alignable with one or more lead members formed in the conductive sheet, and the receiving chuck has a receiving portion alignable with the forming portion and shaped to closely conform to at least part of the forming portion. The conductive sheet is compressed between the forming chuck and the receiving chuck to mechanically pre-form the one or more lead members into one or more pre-formed conductive leads. In one embodiment, the raised forming portion includes a ridge having a polygonal cross-sectional shape and the receiving portion comprises a channel. Alternately, the raised forming portion includes a partially-pyramidal block and the receiving portion comprises a pocket. In yet another embodiment, the raised forming portion includes a plurality of blocks and the receiving portion comprises a plurality of pockets. In still another embodiment of the invention, an apparatus includes a press coupled to the forming chuck that controllably engages the forming chuck against the conductive sheet. In another embodiment, an apparatus includes a handler for controllably positioning the conductive sheet before and after engagement with the forming and receiving chucks.

9 Claims, 6 Drawing Sheets

APPARATUS AND METHOD FOR PROVIDING MECHANICALLY PRE-FORMED CONDUCTIVE LEADS

CROSS-REFERENCE TO RELATED APPLICATION

This application is a divisional of U.S. Patent Application No. 09/378,198, filed Aug. 19, 1999, now Pat. No. 6,221,748.

TECHNICAL FIELD

The present invention relates to an apparatus and method for providing mechanically pre-formed conductive leads for use with, for example, micro-ball grid array packages.

BACKGROUND OF THE INVENTION

As the trend toward decreasing the size of microelectronic packages continues, manufacturing challenges are continuously encountered. One manufacturing challenge is the need for reliable lead bonding.

Figure 1:
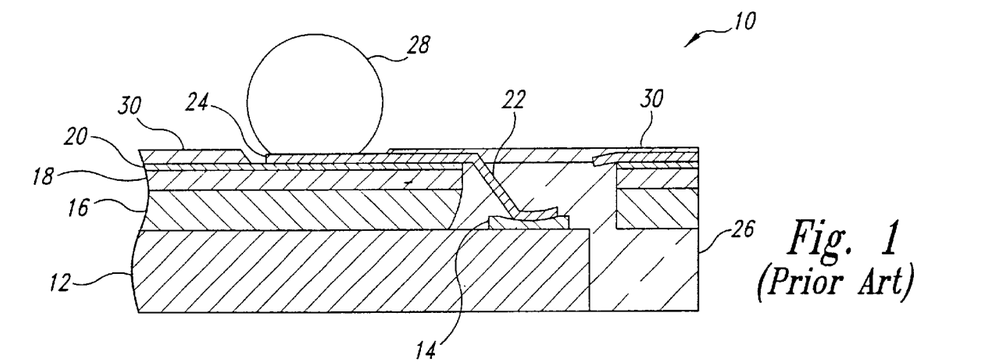
FIG. 1 is a partial cross-sectional elevational view of a micro-BGA package in accordance with the prior art.

FIG. 1 is a partial cross-sectional elevational view of a typical micro-ball grid array (micro-BGA) package 10. The micro-BGA package 10 includes a die 12 having a plurality of bond pads 14 formed thereon. A spacing layer 16 (typically composed of an elastomer material) is formed on the die 12, and an interposer 18 (typically composed of a dielectric material, such as a polyimide tape) is formed on the spacing layer 16. An adhesive layer 20 is formed on the interposer 18.

The micro-BGA package 10 also includes a plurality of conductive leads 22. One end of each lead 22 is coupled to one of the bond pads 14, and the opposite end of the lead 22 terminates in a ball pad 24 that is coupled to the interposer 18 by the adhesive layer 20. An encapsulating material 26 is disposed over the conductive leads 22 and the exposed areas of the die 12 to seal and protect the leads 22 and die 12 from environmental elements. A conductive bump 28 (typically composed of solder) is formed on each ball pad 24. Finally, a coverlay 30 is formed at least partially over the micro-BGA package 10.

The micro-BGA package 10 may be coupled to an electrical circuit (not shown), such as a printed circuit board, by engaging the bumps 26 with corresponding contact pads on the circuit. Micro-BGA packages of the type shown in FIG. 1 are shown and described, for example, in U.S. Pat. Nos. 5,663,106 and 5,777,379 to Karavakis et al, and in U.S. Pat. No. 5,821,608 to DiStefano et al, which patents are incorporated herein by reference.

Figure 2:
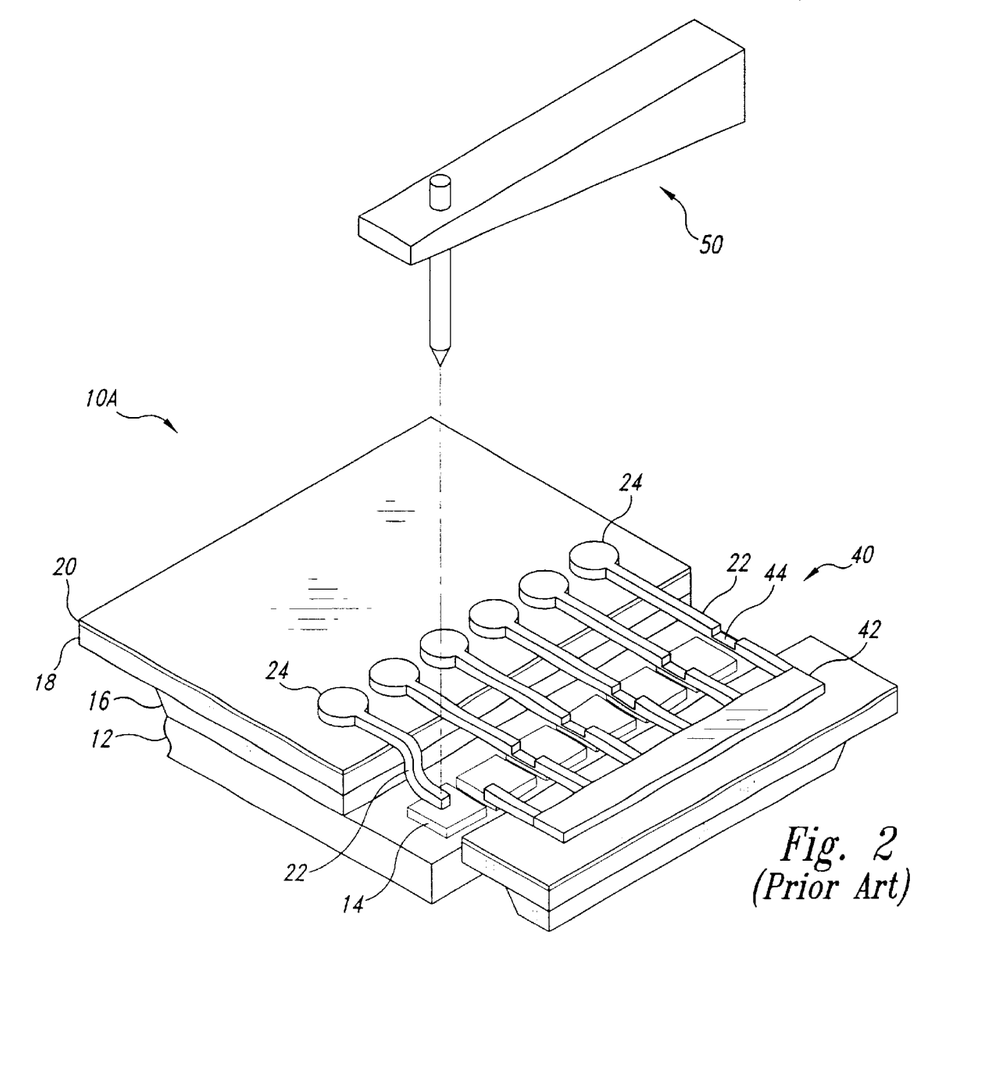
FIG. 2 is an isometric view of a partially-constructed micro-BGA package of FIG. 1.

FIG. 2 is an isometric view of a partially-constructed micro-BGA package 10A of FIG. 1 prior to the addition of the encapsulating material 26, the coverlay 30, or the conductive bumps 28. Typically, the leads 22 are formed from a sheet of conductive material using standard cutting and etching processes to form a lead array 40. The lead array 40 includes a base 42, the plurality of conductive leads 22, which project from the base 42, and the ball pads 24, which are formed at the ends of the leads 22. Each lead 22 may include a frangible section 44. Processes for forming the lead array 40 are shown and described, for example, in International Patent Publication WO94/03036 published Feb. 3, 1994, or U.S. Pat. No. 5,629,239 to DiStefano et al, both of which are incorporated herein by reference.

The ball pads 24 and leads 22 are engaged with the adhesive layer to couple the ball pads 24 and leads 22 to the interposer 18. Then the leads 22 are bonded to the bond pads 14 of the die 12. A bonding tool 50 is typically used to bond the leads 22 to the bond pads 14. As described in U.S. Pat. No. 5,629,239, the bonding tool 50 moves downwardly toward the die 12 until it engages the lead 22. The bonding tool 50 continues moving downwardly, snapping or breaking the frangible section 44 of the lead 22, and downwardly bending the lead 22 until the lead 22 engages the bond pad 14. The bonding tool 50 then bonds the leads 22 to the bond pads 14 in the conventional manner (e.g. thermally, ultrasonically, etc.).

Alternately, one or more of the leads 22 may be broken by depressing a cutting blade (not shown) against the leads 22, bending the leads 22 downwardly until the frangible sections 44 are snapped or broken, as described in U.S. Pat. No. 5,629,239. The bonding tool 50 is then applied to the lead 22 to continue bending the lead 22 downwardly until the lead 22 engages the bond pad 14 and is bonded into position.

One significant problem attributable to these manufacturing methods, however, is that the downward bending and snapping of the leads 22 during the bonding process can adversely effect the physical and electrical connections throughout the micro-BGA package 10. For example, the physical attachment of the ball pads 24 and the leads 22 with the adhesive layer 20 and the interposer 18 may be weakened or detached during the bending of the leads 22, and during the snapping of the frangible sections 44. Also, after one of the leads 22 is bent and bonded to the corresponding bond pad 14, the physical and electrical connection between the lead 22 and the bond pad 14 may be weakened or detached due to flexure of the micro-BGA package 10 (especially the elastomer spacing layer 16) as one or more adjacent leads 22 are being bent, snapped, and bonded to the associated bond pads 14.

Thus, the bending moments exerted on the leads 22, and the compressive forces of the bonding tool 50 on the leads 22, may be communicated throughout the micro-BGA package 10 as the leads 22 are snapped and bent into engagement with the bond pads 14. These forces and moments may adversely impact the physical and electrical connections between the components of the micro-BGA package 10, resulting in a significant rate of failure.

SUMMARY OF THE INVENTION

The present invention relates to an apparatus and method for providing mechanically pre-formed conductive leads for use with, for example, micro-ball grid array (micro-BGA) packages. In one aspect of the invention, an apparatus includes a forming chuck engageable with a first surface of a conductive sheet, and a receiving chuck engageable with a second surface of the conductive sheet opposite from the forming chuck. The forming chuck has a raised forming portion alignable with one or more lead members formed in the conductive sheet, and the receiving chuck has a receiving portion alignable with the forming portion and shaped to closely conform to at least part of the forming portion.

In operation, the conductive sheet may be compressed between the forming chuck and the receiving chuck to mechanically pre-form the one or more lead members into one or more pre-formed conductive leads. Alternately, the operation may further include forming the lead members in the conductive sheet. Because the conductive leads are mechanically pre-formed prior to attachment to the micro-BGA package, the bending moments and compression forces associated with forming and bending the conductive leads are not transmitted to the components of the micro-BGA package.

In one aspect of the invention, the raised forming portion includes a ridge having a polygonal cross-sectional shape and the receiving portion comprises a channel. Alternately, the raised forming portion includes a partially-pyramidal block and the receiving portion comprises a pocket. In yet another aspect, the raised forming portion includes a plurality of blocks and the receiving portion comprises a plurality of pockets.

In still another aspect of the invention, an apparatus includes a press coupled to the forming chuck that controllably engages the forming chuck against the conductive sheet. Alternately, the press may be coupled to the receiving chuck. In yet another aspect, an apparatus includes a handler for controllably positioning the conductive sheet before and after engagement with the forming and receiving chucks.

DETAILED DESCRIPTION OF THE INVENTION

The following description is generally directed toward an apparatus and method for providing mechanically pre-formed conductive leads for use with, for example, micro-ball grid array (micro-BGA) packages. Many specific details of certain embodiments of the invention are set forth in the following description and in FIGS. 3–7 to provide a thorough understanding of such embodiments. One skilled in the art, however, will understand that the present invention may have additional embodiments, or that the present invention may be practiced without several of the details described in the following description.

Figure 3:
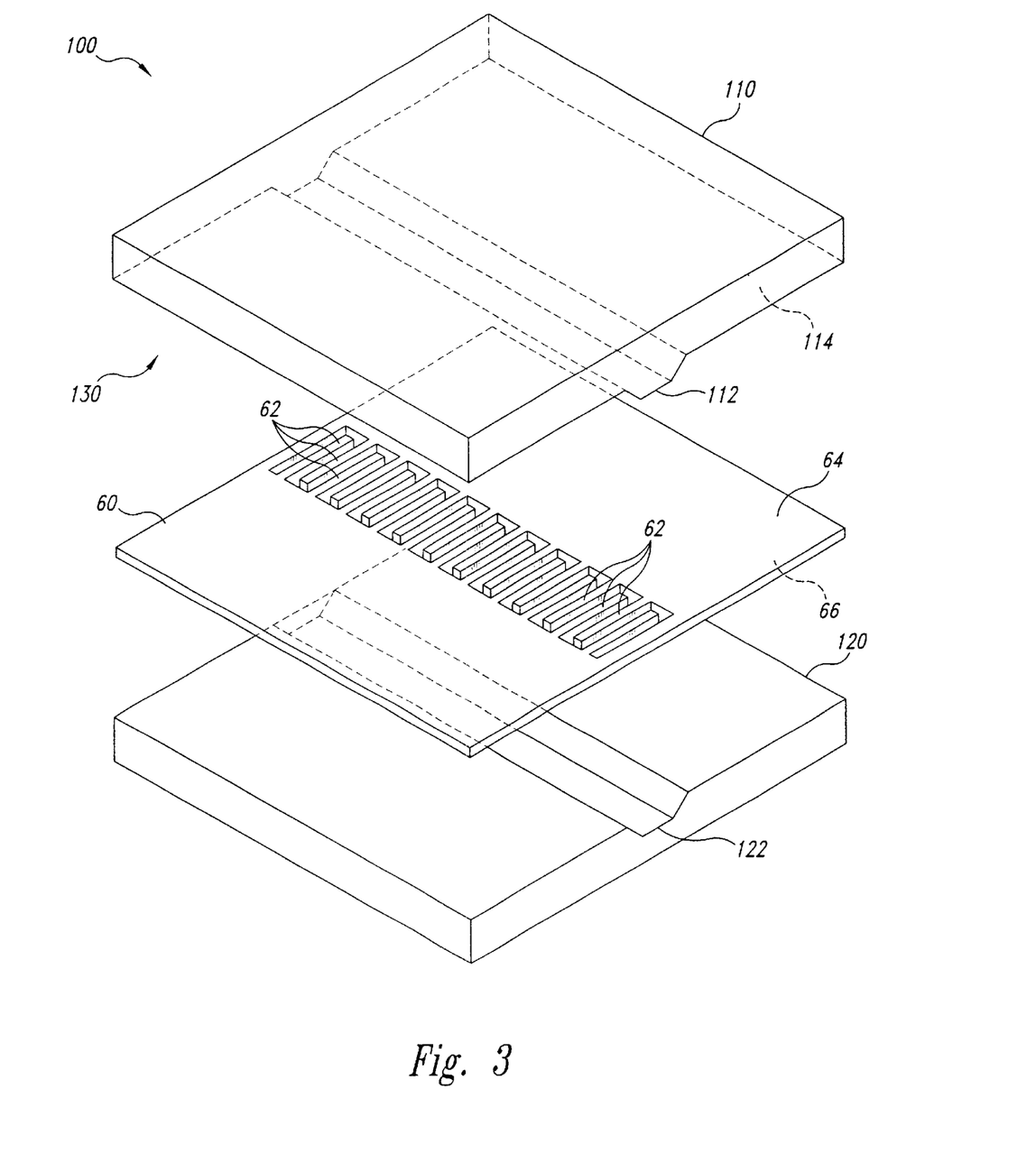
FIG. 3 is an isometric view of an apparatus for providing mechanically pre-formed conductive leads in accordance with an embodiment of the invention.

FIG. 3 is an isometric view of an apparatus 100 for providing mechanically pre-formed conductive leads in accordance with an embodiment of the invention. The apparatus 100 includes a forming chuck 110 having a raised forming portion 112 on a lower surface 114 thereof, and a receiving chuck 120 having a receiving portion 122 shaped to closely conform to at least part of the forming portion 112.

In operation, the forming chuck 110 and the receiving chuck 120 are positioned proximate to, and on opposite sides of, a sheet of conductive material 60 in an open (or disengaged) position 130. The conductive sheet 60 includes a plurality of lead members 62 formed therein, a first (or upper) surface 64, and a second (or lower) surface 66. The lead members 62 may be formed in the conductive sheet 60 using a variety of known manufacturing processes, such as, for example, by etching or cutting the conductive sheet 60.

The forming chuck 110 is placed in contact with the first surface 64 of the conductive sheet 60 with the raised forming portion 112 aligned with the plurality of lead members 62. Similarly, the receiving chuck 112 is placed in contact with the second surface 66 of the conductive sheet 60 with the receiving portion 122 aligned with the lead members 66. The forming chuck 110 and receiving chuck 120 are then compressed together against the conductive sheet 60 with sufficient force to mechanically bend the plurality of lead members 62. As the lead members 62 are compressed between the raised forming portion 112 and the receiving portion 122, the lead members 62 are bent into a shape determined by the cross-sectional shape of the forming portion 112 and receiving portion 122.

Figure 4:
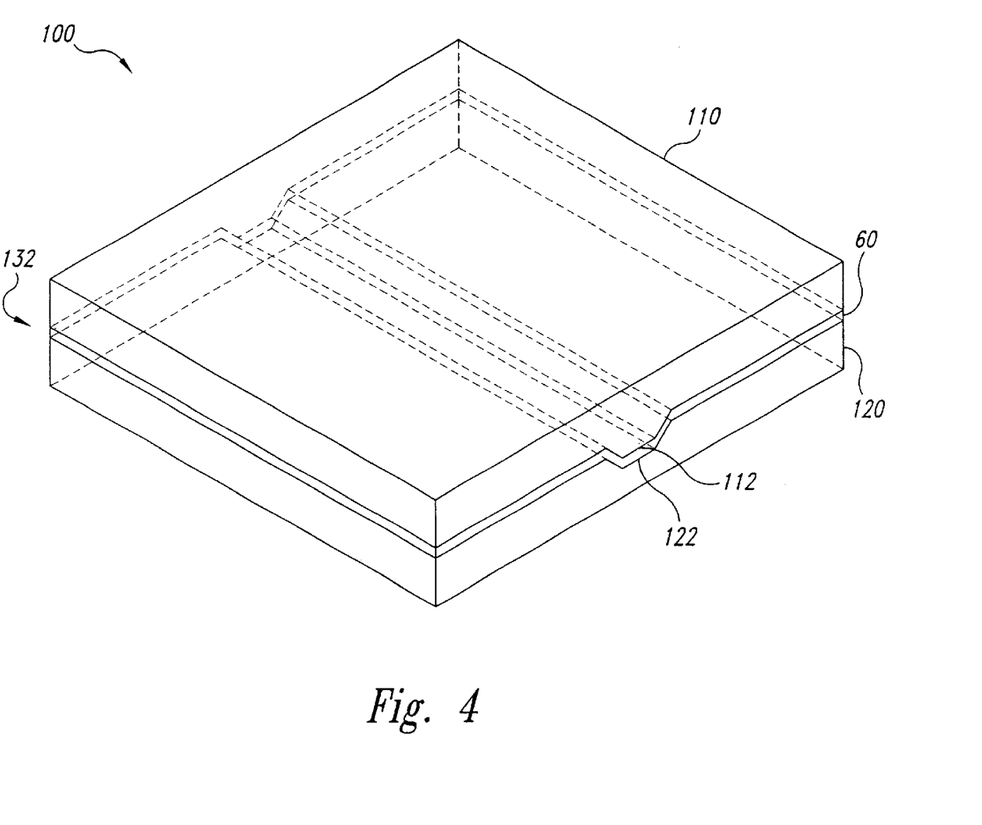
FIG. 4 is an isometric view of the apparatus of FIG. 3 in a closed position.

FIG. 4 is an isometric view of the apparatus 100 of FIG. 3 in a closed (or engaged) position 132. In the closed position 132, the forming chuck 110 and receiving chuck 120 have been compressed together until the plurality of lead members 62 (not shown in FIG. 4) have been bent into a desired pre-formed shape, forming a plurality of pre-formed conductive leads 68.

Figure 5:
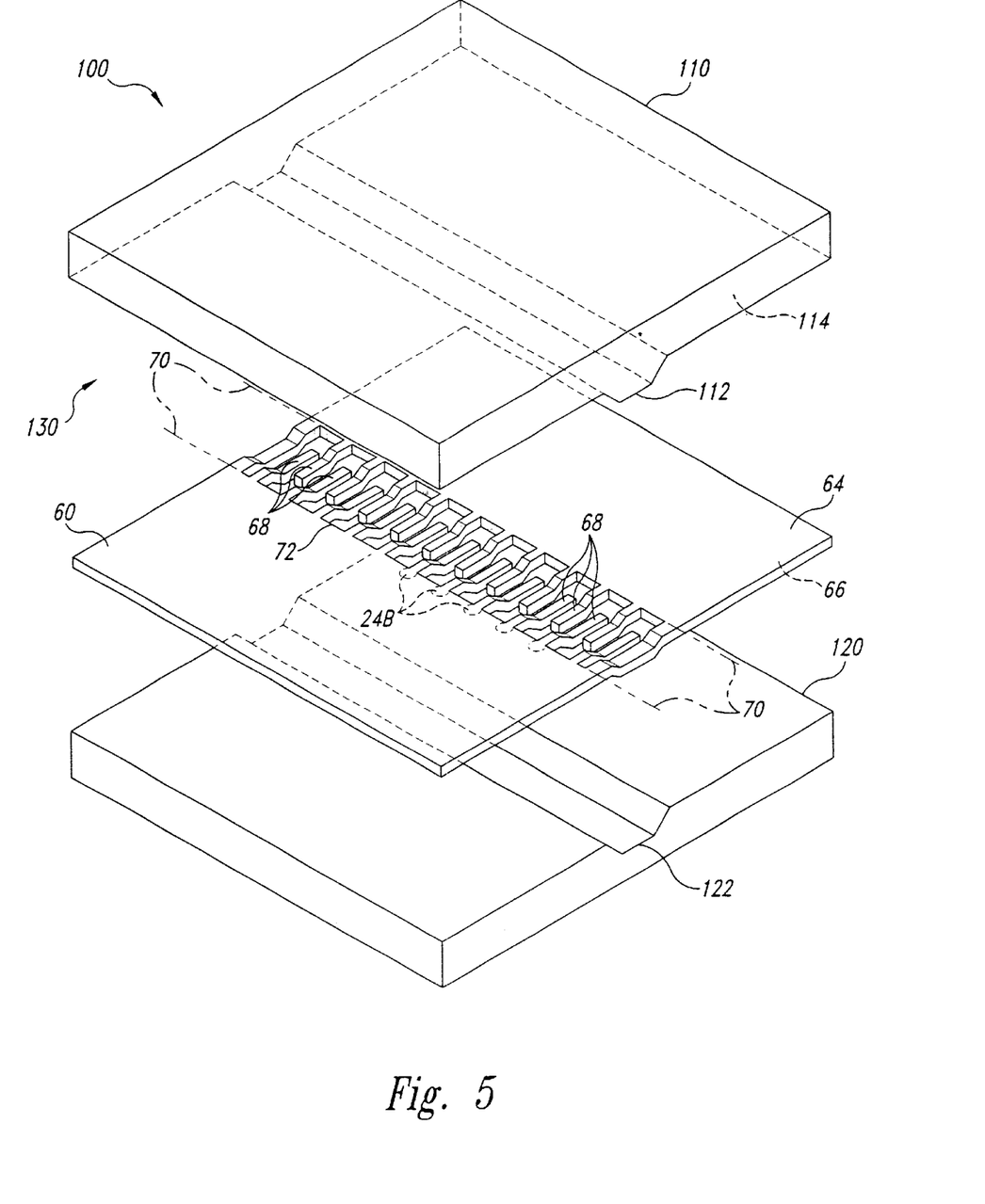
FIG. 5 is an isometric view of the apparatus of FIG. 3 returned to an open position after the leads have been mechanically pre-formed.

FIG. 5 is an isometric view of the apparatus 100 of FIG. 3 returned to the open position 130 after the plurality of lead members 62 have been compressed between the forming chuck 110 and the receiving chuck 120 to form the plurality of pre-formed conductive leads 68. To further prepare the pre-formed conductive leads 68 for use with a microelectronics device, the conductive sheet 60 may undergo further processing. For example, the conductive sheet 60 may be divided along one or more dividing lines 70 so that the conductive leads 68 project from an edge 72 of the conductive sheet 60.

Figure 6:
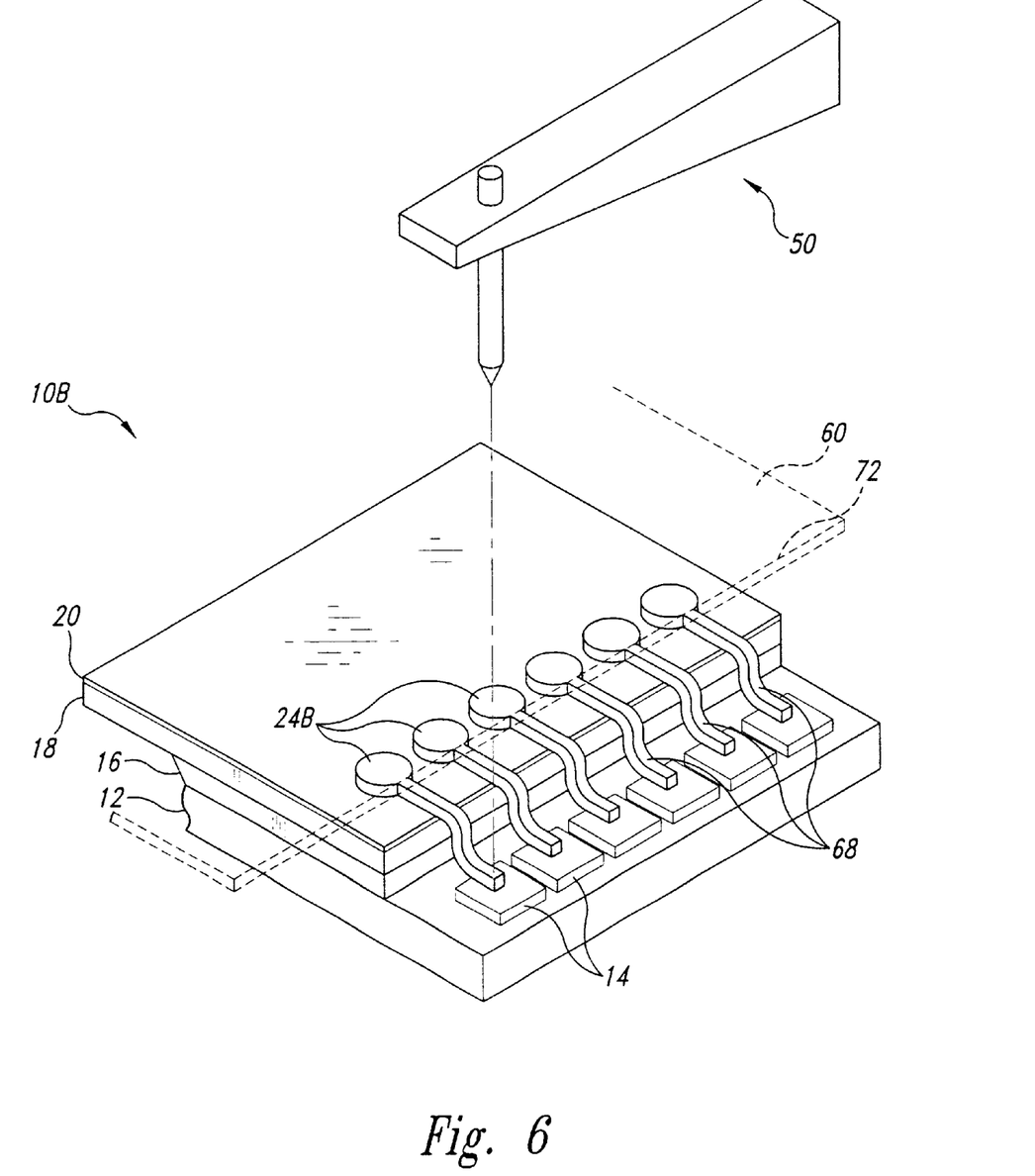
FIG. 6 is an isometric view of a partially-constructed micro-BGA package formed using the plurality of mechanically pre-formed conductive leads of FIG. 5.

FIG. 6 is an isometric view of a partially-constructed micro-BGA package 10B formed using the plurality of mechanically pre-formed conductive leads 68 of FIG. 5. In this embodiment, the micro-BGA package 10B is formed by engaging the conductive sheet 60 onto the adhesive layer 20 with the pre-formed conductive leads 68 in contact with the bond pads 14 of the die 12. Using well-known manufacturing methods, ball pads 24B may be formed at one end of the pre-formed conductive leads 68, such as by cutting or etching to remove the remainder of the conductive sheet 60. Alternately, the ball pads 24B may be formed at the ends of the pre-formed conductive leads 68 out of the conductive sheet 60 prior to its attachment to the adhesive layer 20, as depicted by the dashed lines in FIG. 5, and each pre-formed conductive lead 68 may be attached to the adhesive layer 20 individually. The pre-formed conductive leads 68 may then be bonded to the bond pads 14 using the bonding tool 50.

The apparatus 100 and associated methods for providing mechanically pre-formed conductive leads 68 advantageously eliminate the bending moments and compressive forces that are exerted by the bonding tool 50 on the leads 22 that were existent in the prior art method of attaching the leads 22 to the bond pads 14. Because the conductive leads 68 are mechanically pre-formed, there is no need to snap the leads off and bend the leads into engagement with the bond pads 14. The forces and moments which were formerly communicated throughout the micro-BGA package 10 as the leads 22 were snapped and bent by the bonding tool 50, and the packaging failures attributable to these forces and moments, are eliminated.

One may note that the cross-sectional shapes of the forming portion 112 and receiving portion 122 may be modified to provide any desired shape of the pre-formed conductive lead 68. For example, in the embodiment shown in FIGS. 3–5, the forming and receiving portions 112, 122 have matching polygonal cross-sectional shapes which provide angularly pre-formed conductive leads 68 as shown in FIG. 5. Alternately, the forming and receiving portions may have smoothly-curved cross-sectional shapes which provide smoothly-curved pre-formed conductive leads 68 (shown in FIG. 6), or any other desired cross-sectional shapes. It is also apparent that the apparatus 100 may be inverted such that the forming chuck 110 engages the lower surface 66 of the conductive sheet 60 and the receiving chuck 120 engages the upper surface 64 of the conductive sheet 60.

Figure 7:
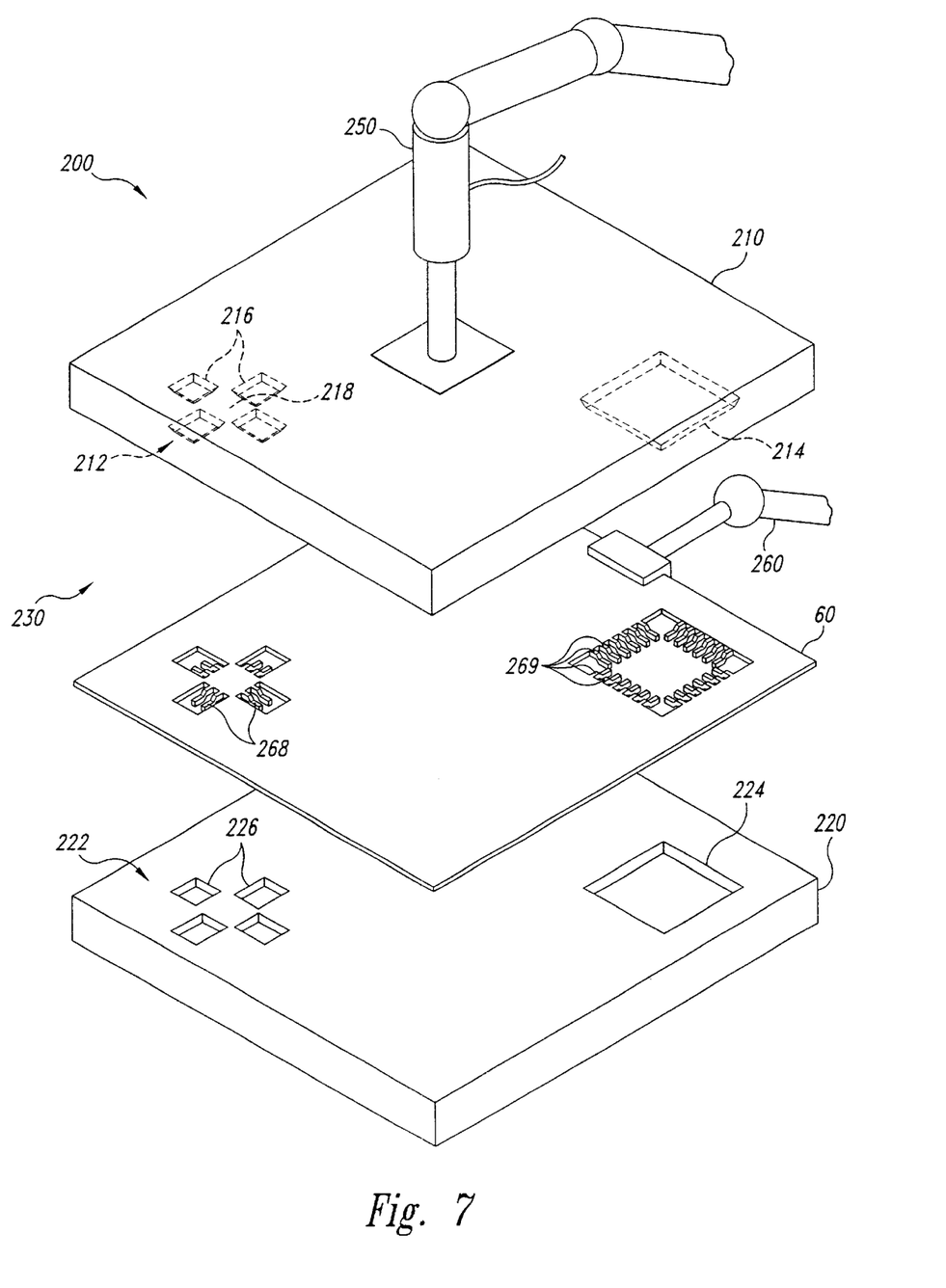
FIG. 7 is an isometric view of an alternate embodiment of an apparatus for providing mechanically pre-formed conductive leads in accordance with the invention.

FIG. 7 is an isometric view of an alternate embodiment of an apparatus 200 for providing mechanically pre-formed conductive leads in accordance with the invention. In this embodiment, the apparatus 200 includes a forming chuck 210 having a first forming portion 212 and a second forming portion 214, and a corresponding receiving chuck 220 having a first receiving portion 222 and a second receiving portion 224. The forming chuck 210 and receiving chuck 220 are shown in an open (or disengaged) position 230. A sheet of conductive material 60 is positioned between the forming and receiving chucks 210, 220. An array of first lead members 262 (not shown) and an array of second lead members 264 (not shown) are formed within the conductive sheet 60 using conventional techniques as described above.

The first forming portion 212 includes four blocks 216 that project from the forming chuck 210. The blocks 216 have a substantially trapezoidal cross-sectional shape and are arranged about a substantially rectangular central region 218. Similarly, the first receiving portion 222 has four pockets 226 that are aligned with and sized to closely conform to the four blocks 216. The second forming portion 214 has a partially-pyramidal shape and projects from the forming chuck 210. The second receiving portion 224 of the receiving chuck 220 has a correspondingly partially-pyramidal shape that is aligned with and sized to closely conform to the second forming portion 214.

The apparatus 200 further includes a robotic press 250 coupled to the forming chuck 210 for controllably actuating the forming chuck 210 into engagement with the conductive sheet 60. Alternately, the robotic press 250 may be coupled to the receiving chuck 220. A handler 260 is coupled to the conductive sheet 60 for controllably positioning the sheet before and after engagement with the forming and receiving chucks 210, 220. Numerous types of robotic presses 250 and handlers 260 are commercially available that may be used or adapted for use with the inventive apparatus 200, including, for example, those shown and described in U.S. Pat. No. 5,184,068 to Twigg et. al., U.S. Pat. No. 5,828,223 to Rabkin et. al., and the series of IC handlers available from Verilogic Corporation of Denver, Col.

During operation of the apparatus 200 shown in FIG. 7, the handler 260 positions the conductive sheet 60 between the forming chuck 210 and the receiving chuck 220, aligning the array of first lead members 262 with the blocks 216 and the array of second lead members 264 with the second forming portion 214. The robotic press 250 actuates the forming chuck 210 so that the forming and receiving chucks 210, 220 engage the conductive sheet 60 with sufficient compressive force to bend the first and second lead members 262, 264 into the desired pre-formed shape.

After the first and second lead members 262, 264 have been pre-formed, the robotic press 250 controllably disengages the forming chuck 210 from against the conductive sheet 60, and the handler 260 disengages the conductive sheet 60 from the receiving chuck 220. Thus, the array of first lead members 262 are mechanically pre-formed into a plurality of first conductive leads 268, and the array of second lead members 264 are pre-formed into a plurality of second conductive leads 269. The conductive sheet 60 may then undergo additional processing as described above to separate the first and second pre-formed conductive leads 268, 269, to form ball pads on the ends of the pre-formed conductive leads, or to couple the pre-formed conductive leads with other components of a micro-electronics package.

The apparatus 200 shown in FIG. 7 advantageously provides the capability of producing pre-formed conductive leads in both a "fan-in" or "fan-out" configurations. It may also be observed that the blocks 216 of the first forming portion 212 may be oriented in any desired arrangement, and may be modified to other desired shapes (smoothly-curved, etc.). The blocks 216 may even be modified to provide "fan-out" pre-formed conductive leads 268 which project from a circular, elliptic, or partially-elliptic central region 218. Similarly, the second forming portion 214 may be modified to a wide variety of sizes and shapes to provide a correspondingly wide variety of "fan-in" pre-formed conductive lead configurations. Pre-formed conductive leads may therefore be used in a wide variety of commercial micro-BGA applications.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part with prior art apparatus and methods to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other apparatus and methods for providing mechanically pre-formed conductive leads, and not just to the apparatus and methods described above and shown in the figures. In general, in the following claims, the terms used should not be construed to limit the invention to the specific embodiments disclosed in the specification and the claims, but should be construed to include all apparatus and methods for providing mechanically pre-formed conductive leads that operate within the broad scope of the claims. Accordingly, the invention is not limited by the foregoing disclosure, but instead its scope is to be determined by the following claims.

What is claimed is:

1. An apparatus for providing a pre-formed conductive lead from a sheet of conductive material having a lead member formed therein, comprising:

a forming chuck engageable with a first surface of the conductive sheet, the forming chuck having a raised forming portion alignable with the lead member; and a receiving chuck engageable with a second surface of the conductive sheet opposite from the forming chuck, the receiving chuck having a receiving portion alignable with the lead member and shaped to conform to at least part of the forming portion, and wherein the raised forming portion comprises a partially-pyramidal block and the receiving portion comprises a pocket.

2. The apparatus of claim 1 wherein the raised forming portion comprises a ridge having a polygonal cross-sectional shape and the receiving portion comprises a channel.

3. The apparatus of claim 1, further comprising a press coupled to the forming chuck that controllably engages the forming chuck against the conductive sheet.

4. The apparatus of claim 1, further comprising a handler coupleable to the conductive sheet for controllably positioning the conductive sheet.

5. An apparatus for providing a plurality of pre-formed conductive leads from a sheet of conductive material having a plurality of lead members formed therein, comprising:

a forming chuck engageable with a first surface of the conductive sheet, the forming chuck having a raised forming portion alignable with the plurality of lead members;

a receiving chuck engageable with a second surface of the conductive sheet opposite from the forming chuck, the receiving chuck having a receiving portion alignable with the plurality of lead members and shaped to conform to at least part of the forming portion, and wherein the raised forming portion comprises a partially-pyramidal block and the receiving portion comprises a pocket; and a press coupled to the forming chuck that controllably engages the forming chuck against the conductive sheet.

6. The apparatus of claim 5 wherein the raised forming portion comprises a ridge having a polygonal cross-sectional shape and the receiving portion comprises a channel.

7. The apparatus of claim 5 wherein the raised forming portion comprises a plurality of blocks and the receiving portion comprises a plurality of pockets.

8. The apparatus of claim 7 wherein at least one block has a trapezoidal cross-sectional shape.

9. The apparatus of claim 5, further comprising a handler coupleable to the conductive sheet for controllably positioning the conductive sheet.

\* \* \* \* \*